United States Patent
Miyahara

(10) Patent No.: US 11,967,509 B2
(45) Date of Patent: Apr. 23, 2024

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventor: Osamu Miyahara, Kumamoto (JP)

(73) Assignee: TOKYO ELECTRON LIMITED, Tokyo (JP)

(*) Notice: Subject to any disclaimer, the term of this patent is extended or adjusted under 35 U.S.C. 154(b) by 785 days.

(21) Appl. No.: 17/029,296

(22) Filed: Sep. 23, 2020

(65) Prior Publication Data

US 2021/0005471 A1    Jan. 7, 2021

Related U.S. Application Data

(63) Continuation of application No. 16/045,941, filed on Jul. 26, 2018, now Pat. No. 10,818,521.

(30) Foreign Application Priority Data

Aug. 7, 2017 (JP) ................................. 2017-152612

(51) Int. Cl.
| | |
|---|---|
| H01L 21/67 | (2006.01) |
| B08B 1/00 | (2006.01) |
| B08B 1/02 | (2006.01) |
| B08B 3/04 | (2006.01) |
| H01L 21/02 | (2006.01) |
| H01L 21/687 | (2006.01) |

(52) U.S. Cl.
CPC ........ *H01L 21/67051* (2013.01); *B08B 1/002* (2013.01); *B08B 1/02* (2013.01); *B08B 3/041* (2013.01); *H01L 21/02057* (2013.01); *H01L 21/67017* (2013.01); *H01L 21/67028* (2013.01); *H01L 21/67034* (2013.01); *H01L 21/67046* (2013.01); *H01L 21/68728* (2013.01); *H01L 21/02052* (2013.01); *H01L 21/0209* (2013.01)

(58) Field of Classification Search
CPC ......... H01L 21/67034; H01L 21/67046; H01L 21/67051
See application file for complete search history.

(56) References Cited

U.S. PATENT DOCUMENTS 10,818,521 B2 * 10/2020 Miyahara .................. B08B 1/02
2013/0213442 A1    8/2013 Kaise et al.
(Continued)

FOREIGN PATENT DOCUMENTS

JP        2015-231030 A      12/2015

*Primary Examiner* — Marc Lorenzi
(74) *Attorney, Agent, or Firm* — Venjuris, P.C.

(57) ABSTRACT

Disclosed is a substrate processing apparatus including: a substrate holding member that holds a peripheral portion of a substrate; a rotating member that includes a plate provided with the substrate holding member and rotates the substrate by rotating the plate; a fluid supply unit that is disposed at a center of the rotating member and supplies a processing liquid and an inert gas to a lower surface of the substrate held by the substrate holding member; and a controller that controls to perform a liquid processing by supplying the processing liquid to the lower surface of the substrate while rotating the substrate, and, after the liquid processing, to perform a drying processing of the substrate while supplying the inert gas to the lower surface of the substrate.

8 Claims, 7 Drawing Sheets

(56) References Cited

U.S. PATENT DOCUMENTS

| | | | |
|---|---|---|---|
| 2016/0064259 A1* | 3/2016 | Kurusu | H01L 21/67017 |
| | | | 134/99.1 |
| 2016/0204006 A1* | 7/2016 | Fujii | H01L 21/67051 |
| | | | 156/345.23 |
| 2018/0315624 A1 | 11/2018 | Nakamura et al. | |

* cited by examiner

*FIG. 6*
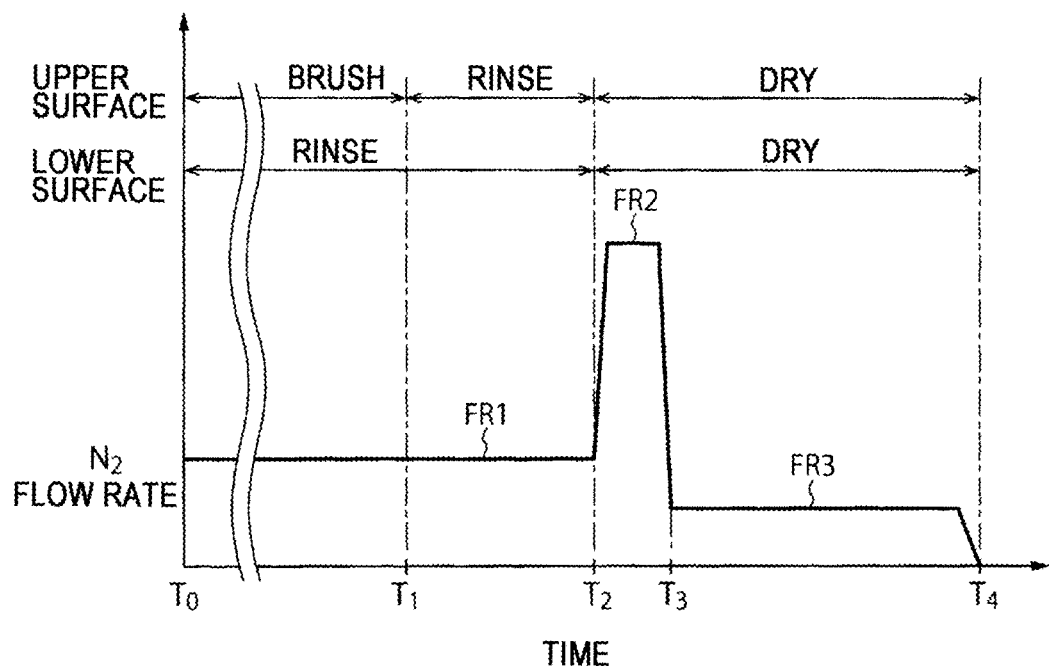
*FIG. 7A*    *FIG. 7B*
             [Prior Art]
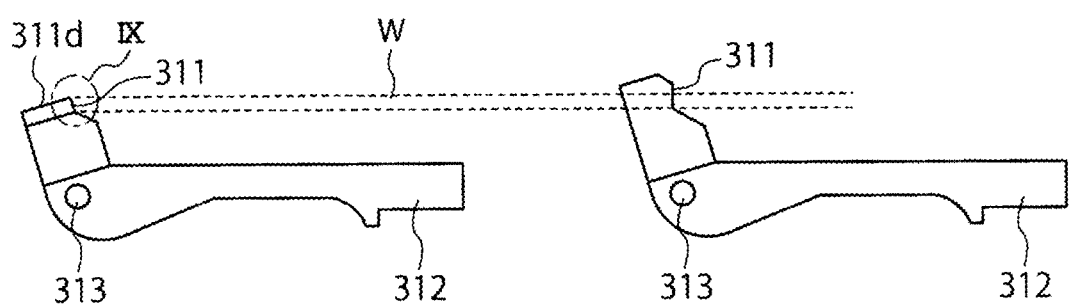

SUBSTRATE PROCESSING APPARATUS, SUBSTRATE PROCESSING METHOD, AND STORAGE MEDIUM

CROSS-REFERENCE TO RELATED APPLICATIONS

This application is a divisional application of U.S. patent application Ser. No. 16/045,941 filed on Jul. 26, 2018, which claims priority from Japanese Patent Application No. 2017-152612 filed on Aug. 7, 2017, with the Japan Patent Office, all of which are incorporated herein by reference in their entireties.

TECHNICAL FIELD

The present disclosure relates to a technique of drying a lower surface of a substrate after a liquid processing is performed on the substrate by supplying a processing liquid to the lower surface.

BACKGROUND

In a substrate processing apparatus used for manufacturing a semiconductor device, there is a case where a rinse processing is performed on a lower surface of a substrate (e.g., a semiconductor wafer) by supplying a rinse liquid (e.g., deionized water) to the lower surface while rotating the substrate about a vertical axis in a horizontal posture. When performing the liquid processing, the substrate is held by a spin chuck (substrate rotating and holding mechanism) including a disk-shaped base member and a plurality of chuck members provided at a peripheral portion of the base member and configured to chuck a peripheral portion of the substrate. The "lower surface of the substrate" is a surface facing downward during the processing. The surface may be either a front surface that is a device forming surface or a rear surface that is a device non-forming surface.

After the rinse processing on the lower surface is completed, shake-off drying is performed by rotating the substrate at a high speed. In order to satisfactorily dry the substrate, a small circular drying area (dry core) may be first formed at a central portion of the substrate, and an outer peripheral edge of the drying area may be gradually expanded concentrically. By doing so, even when particles are present in the liquid, the particles are driven away from the substrate together with the liquid. Thus, it is possible to suppress particles from remaining on the dried substrate.

When shake-off drying is performed, a gas having a low humidity and desirably a low oxygen concentration (e.g., nitrogen gas) is supplied to the lower surface of the substrate in order to promote drying and suppress the occurrence of water marks (see, e.g., Japanese Patent Laid-Open Publication No. 2015-231030). Since the supply amount of the nitrogen gas influences the formation and expansion of the dry core, the supply amount must be controlled within a suitable range. When the supply amount of the nitrogen gas is excessive, the expanding speed of the dry core becomes excessive. Thus, a tear-off of the liquid film on the outer side of the dry core (occurrence of liquid droplets separated from the liquid film) may occur. When particles are present in a torn liquid droplet, the particles will be re-attached to the substrate after drying the liquid droplet.

Further, in parallel with the above-described liquid processing on the lower surface, a liquid processing, for example, a scrub cleaning or an atomize spray (AS) cleaning processing may be performed on an upper surface of the substrate. In this case, particles derived from substances removed from the substrate surface by the cleaning processing flow together with the processing liquid toward the peripheral portion of the substrate, and finally scatter to the outside of the substrate. The processing liquid including the particles may go around to the lower surface and attached to the chuck members and the lower surface of the substrate around the chuck members.

SUMMARY

According to an embodiment of the present disclosure, there is provided a substrate processing apparatus including a substrate holding member that holds a peripheral portion of a substrate, a rotating member that includes a plate provided with the substrate holding member and rotates the substrate by rotating the plate, a fluid supply unit that is disposed at a center of the rotating member and supplies a processing liquid and an inert gas to a lower surface of the substrate held by the substrate holding member, and a controller that controls to perform a liquid processing by supplying the processing liquid to the lower surface of the substrate while rotating the substrate, and, after the liquid processing, to perform a drying processing of the substrate while supplying the inert gas to the lower surface of the substrate. The controller controls to supply the inert gas at a first supply flow rate in a state where a liquid film is present at a central portion of the lower surface of the substrate after starting the drying processing, and supply the inert gas at a second supply flow rate lower than the first supply flow rate after the liquid film is no longer present at the central portion of the lower surface.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a graph for explaining a transition of a supply amount of nitrogen gas.

FIGS. 7A and 7B are views for explaining a modified substrate holding member. FIG. 7A is a side view illustrating the substrate holding member after modification, and FIG. 7B is a side view illustrating the substrate holding member before modification.

DETAILED DESCRIPTION

Figure 1:
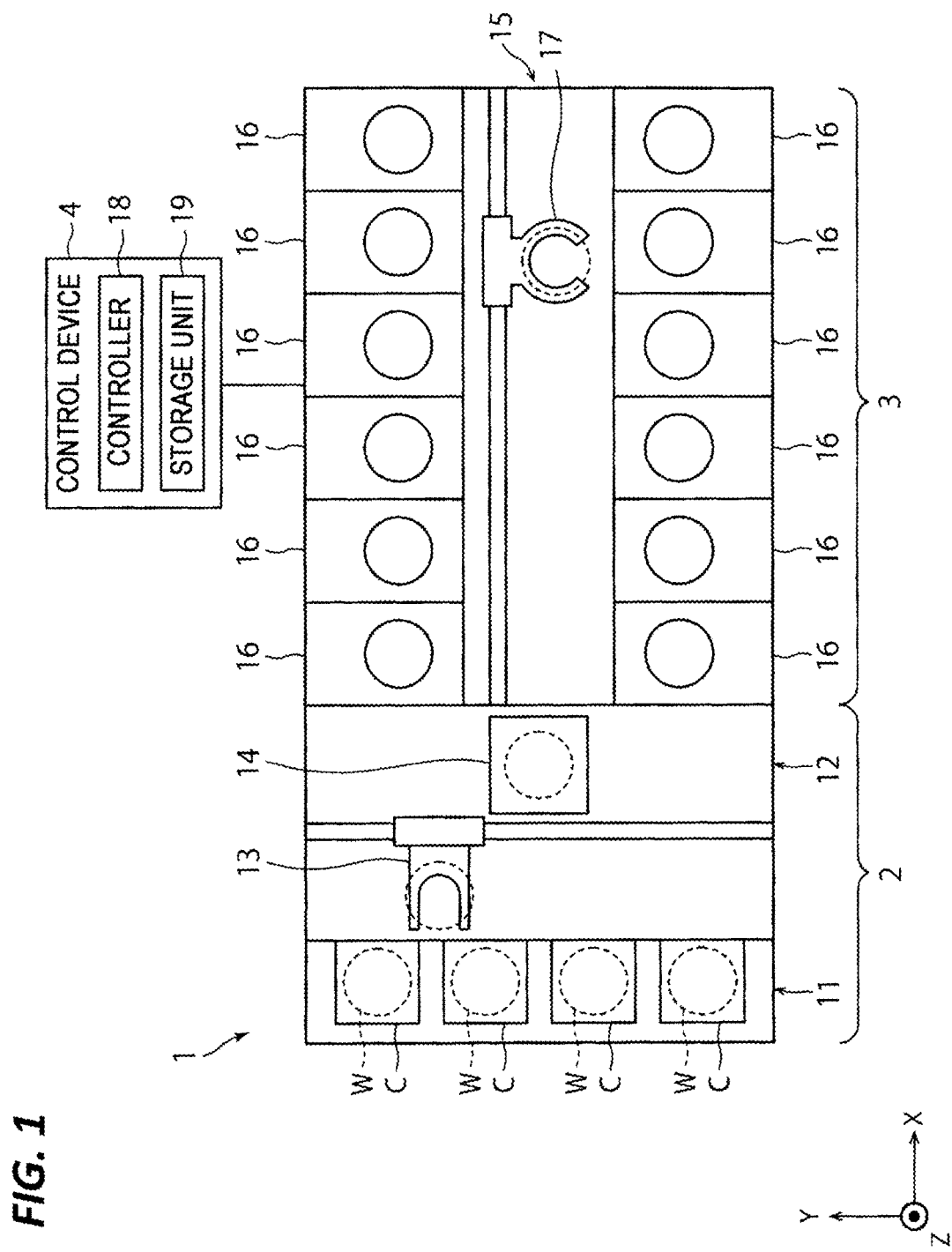
FIG. 1 is a schematic plan view illustrating an overall configuration of a substrate processing system according to an embodiment of a substrate processing apparatus of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure is to provide a technique capable of suppressing liquid droplets from being generated due to tear-off of a liquid film at the outer side of a drying area when drying a lower surface of a substrate, and suppressing particles from being attached to a lower surface of a chuck member the lower surface of the substrate around the chuck member.

According to an embodiment of the present disclosure, there is provided a substrate processing apparatus including a substrate holding member that holds a peripheral portion of a substrate, a rotating member that includes a plate provided with the substrate holding member and rotates the substrate by rotating the plate, a fluid supply unit that is disposed at a center of the rotating member and supplies a processing liquid and an inert gas to a lower surface of the substrate held by the substrate holding member, and a controller that controls to perform a liquid processing by supplying the processing liquid to the lower surface of the substrate while rotating the substrate, and, after the liquid processing, to perform a drying processing of the substrate while supplying the inert gas to the lower surface of the substrate. The controller controls to supply the inert gas at a first supply flow rate in a state where a liquid film is present at a central portion of the lower surface of the substrate after starting the drying processing, and supply the inert gas at a second supply flow rate lower than the first supply flow rate after the liquid film is no longer present at the central portion of the lower surface.

In the above-described substrate processing apparatus, the first supply flow rate in the drying processing is a flow rate sufficient to blow off the processing liquid attached to the substrate holding member.

In the above-described substrate processing apparatus, in the liquid processing, the controller controls to supply the inert gas from the fluid supply unit at a third flow rate, and the second supply flow rate in the drying processing is lower than the third flow rate.

The above-described substrate processing apparatus further includes a brush that performs a scrub cleaning on an upper surface of the substrate held in the substrate holding member. The controller controls to perform the scrub cleaning using the brush on the upper surface of the substrate while performing the liquid processing on the lower surface of the substrate.

According to another embodiment of the present disclosure, there is provided a substrate processing method for processing a substrate using a substrate processing apparatus including a substrate holding member that holds a peripheral portion of a substrate, a rotating member that includes a plate provided with the substrate holding member and rotates the substrate by rotating the plate, and a fluid supply unit that is disposed at the center of the rotating member and supplies a processing liquid and an inert gas to a lower surface of the substrate held by the substrate holding member. The substrate processing method includes performing a liquid processing by supplying the processing liquid to the lower surface of the surface while rotating the substrate, and after supplying the processing liquid, performing a drying processing on the substrate while supplying the inert gas to the lower surface of the substrate. In the substrate processing method, the inert gas is supplied at a first supply flow rate in a state where a liquid film is present at a central portion of the lower surface of the substrate after starting the drying processing, and the inert gas is supplied at a second supply flow rate lower than the first supply flow rate after the liquid film is no longer present at the central portion of the lower surface.

In the above-described substrate processing method, the first supply flow rate in the drying processing is a flow rate sufficient to blow off the processing liquid attached to the substrate holding member.

In the above-described substrate processing method, in the performing of the liquid processing, the inert gas is supplied from the fluid supply unit at a third flow rate, and the second supply flow rate is lower than the third flow rate.

In the above-described substrate processing method, a scrub cleaning is performed on the upper surface of the substrate using a brush when the liquid processing is performed on the lower surface of the substrate.

According to yet another embodiment of the present disclosure, there is provided non-transitory computer-readable storage medium that stores a program that, when executed, causes a computer to execute the above-described substrate processing method.

According to the embodiment of the present disclosure, the particles attached to the substrate holding member may be blown away by supplying the inert gas at a relatively high flow rate while a relatively thick liquid film covers the entire lower surface of the substrate. Further, when the liquid film is no longer present at the center of the lower surface of the substrate, the inert gas may be supplied at a relatively low flow rate such that the speed at which the drying area expands is suppressed from becoming excessive. Therefore, it is possible to suppress the occurrence of particles due to the tear-off of the liquid.

Hereinafter, various embodiments of the present disclosure will be described with reference to the drawings.

FIG. 1 is a view illustrating a schematic configuration of a substrate processing system according to an embodiment of the present disclosure. Hereinafter, in order to clarify positional relationships, the X-axis, the Y-axis, and the Z-axis are defined as being orthogonal to each other. The positive Z-axis direction is regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 includes a carrier placing section 11 and a transfer section 12. A plurality of carriers C are placed in the carrier placing section 11 to accommodate a plurality of wafers W horizontally.

The transfer section 12 is provided adjacent to the carrier placing section 11, and includes a substrate transfer device 13 and a delivery unit 14 therein. The substrate transfer device 13 includes a substrate holding mechanism configured to hold the wafer W. Further, the substrate transfer device 13 is movable horizontally and vertically, pivotable around a vertical axis, and transfers the wafers W between the carriers C and the delivery unit 14 by using the substrate holding mechanism.

The processing station 3 is provided adjacent to the transfer section 12. The processing station 3 includes a transfer section 15 and a plurality of processing units 16. The plurality of processing units 16 are arranged side by side on both sides of the transfer section 15.

The transfer section 15 includes a substrate transfer device 17 therein. The substrate transfer device 17 includes a substrate holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the substrate holding mechanism.

Each of the processing units 16 performs a predetermined substrate processing on the wafers W transferred by the substrate transfer device 17.

Further, the substrate processing system 1 includes a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the delivery unit 14. The wafer W placed on the delivery unit 14 is taken out from the delivery unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. Then, the processed wafer W, which is placed on the delivery unit 14, returns to the carrier C of the carrier placing section 11 by the substrate transfer device 13.

Next, a schematic configuration of the processing unit 16 will be described with reference to FIGS. 2 and 3. Unless otherwise specified, all members illustrates in FIG. 3 substantially correspond to a rotating body as a geometrical term.

Figure 2:
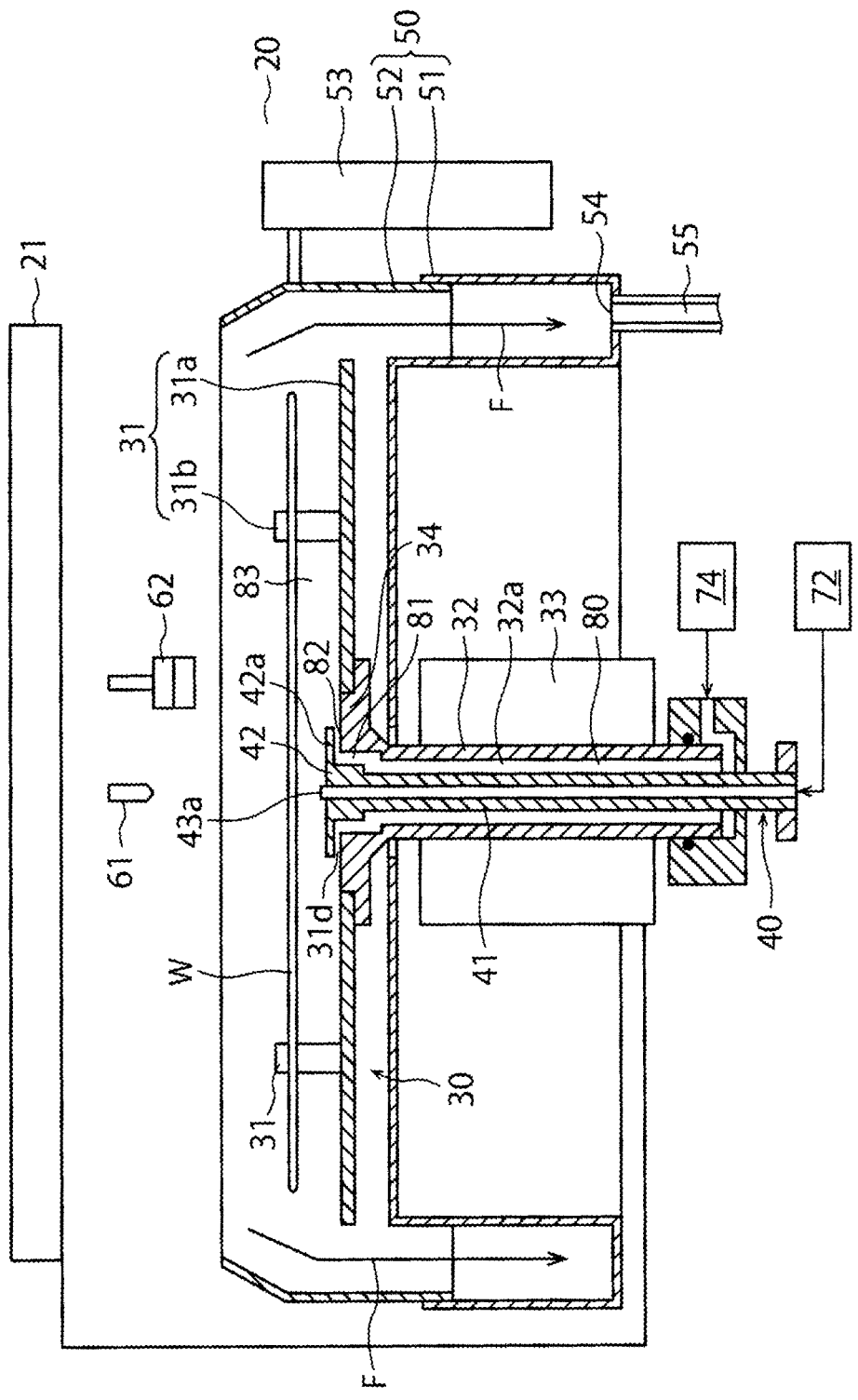
FIG. 2 is a schematic vertical sectional view of a processing unit included in a substrate liquid processing system of FIG. 1.
Figure 3:
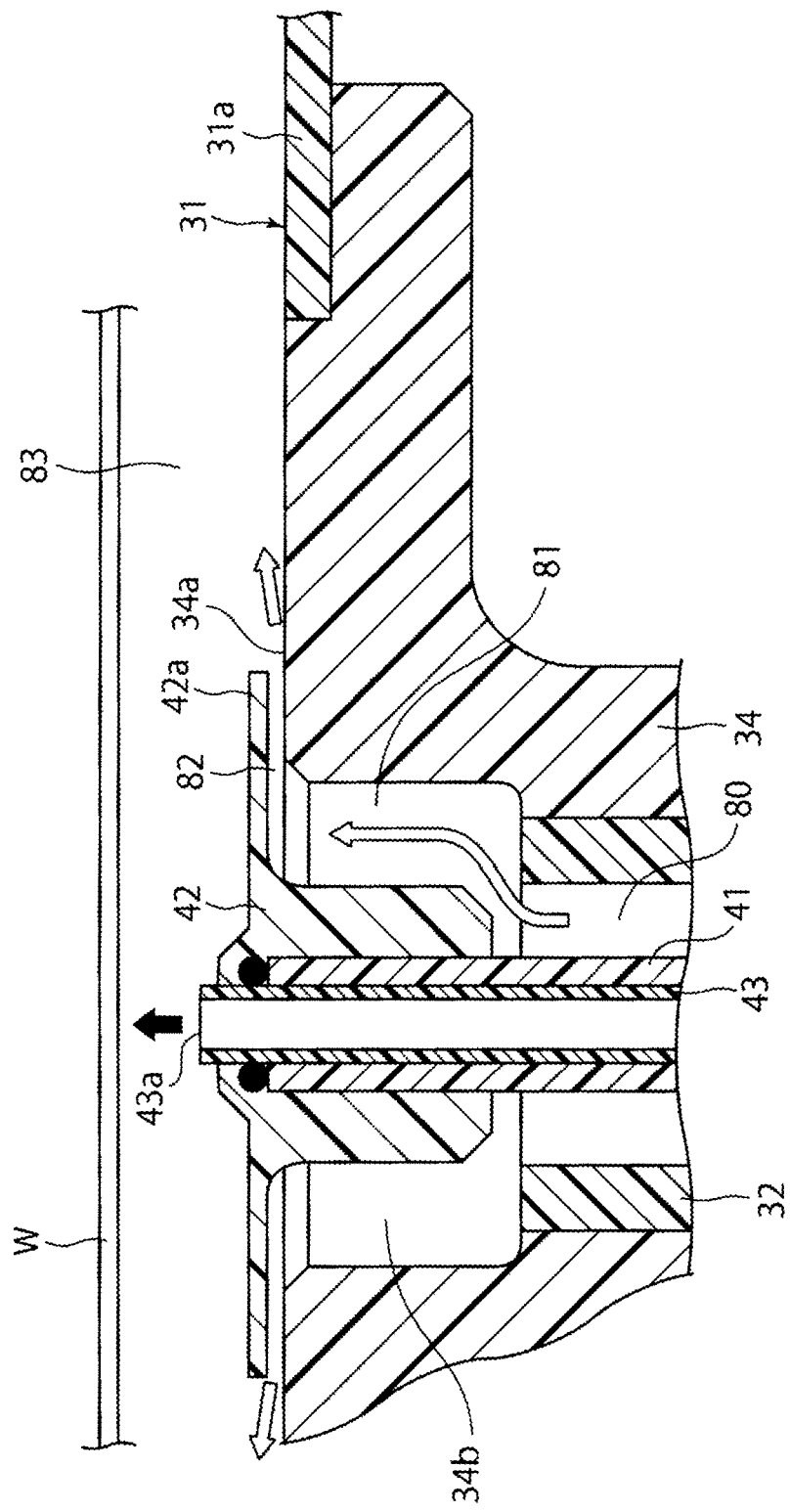
FIG. 3 is an enlarged cross-sectional view illustrating a vicinity of an ejection port of a processing liquid and an ejection port of a drying gas in the processing unit of FIG. 2.

As illustrated in FIG. 2, the processing unit 16 includes a chamber 20, a substrate holding and rotating mechanism 30 configured to hold and rotate the wafer W, a liquid ejecting unit 40 that constitutes a processing liquid supply nozzle, and a recovery cup 50 configured to recover the processing liquid after being supplied to the wafer W.

The chamber 20 accommodates the substrate holding and rotating mechanism 30, the liquid ejecting unit 40, and the recovery cup 50. A fan filter unit (FFU) 21 is provided on the ceiling of the chamber 20. The FFU 21 forms a down flow within the chamber 20.

The substrate holding and rotating mechanism 30 is configured as a mechanical chuck that holds the wafer W by a mechanical clamp mechanism. The substrate holding and rotating mechanism 30 includes a substrate holding unit 31, a rotation shaft 32, and a rotation motor (rotation driving unit) 33. A rotation speed of the rotation motor 33 may be continuously changed to an arbitrary value under the control of the control device 4. The rotation motor 33 rotationally drives the rotation shaft 32, so that the wafer W held in a horizontal position by the substrate holding unit 31 rotates around the vertical axis.

The substrate holding unit 31 includes a disk-shaped base plate (plate-like body) 31a and a plurality of holding members 31b (chucks) provided on the peripheral portion of the base plate 31a. The holding members 31b hold the periphery of the wafer W. In an embodiment, some of the plurality of holding members 31b are movable support members that move back and forth with respect to the periphery of the wafer W to switch between gripping and releasing of the wafer W, and the remaining holding members 31b are immovable holding members (e.g., support pins). The rotation shaft 32 is formed of a hollow tubular body extending in the vertical direction.

The rotation shaft 32 and the base plate 31a are connected through a connecting portion 34. The connecting portion 34 may be a separate component from the rotation shaft 32 and the base plate 31a, or may be an integral component with the rotation shaft 32 or the base plate 31a.

The liquid ejecting unit 40 is formed as an elongated shaft-like member extending in the vertical direction as a whole. The liquid ejecting unit 40 includes a shaft portion 41 extending in the vertical direction and a head portion 42. The shaft portion 41 is inserted into a cylindrical cavity 32a inside the rotation shaft 32 of the substrate holding and rotating mechanism 30. The shaft portion 41 and the rotation shaft 32 are concentric to each other. A space serving as a gas passage 80 having an annular cross-section is formed between the outer peripheral surface of the shaft portion 41 and the inner peripheral surface of the rotation shaft 32.

A drying gas is supplied from a drying gas supply mechanism 74 to the gas passage 80. The drying gas may have a low humidity so as to promote drying, and may have a low oxygen concentration in order to suppress occurrence of water marks. In the present embodiment, the drying gas may be nitrogen gas that has a low humidity and also has a low oxygen concentration. Although illustration and detailed description of the configuration of the drying gas supply mechanism 74 is omitted, the drying gas supply mechanism 74 is constituted by, for example, a supply line connected to a gas supply source, and an opening/closing valve and a flow rate control valve interposed in the supply line.

Inside the liquid ejecting unit 40, there is a cylindrical cavity extending in the vertical direction. A processing liquid supply pipe 43 (only illustrated in FIG. 3) is provided inside the cavity. An upper end of the processing liquid supply pipe 43 is opened at the central portion of the upper surface of the head portion 42 of the liquid ejecting unit 40 and serves as an liquid ejecting port 43a that ejects the processing liquid toward the central portion of the lower surface of the wafer W held in the substrate holding and rotating mechanism 30 (see, e.g., the black arrow in FIG. 3).

A rinse liquid, for example, deionized water (DIW) for cleaning the lower surface of the wafer W is supplied from a processing supply mechanism 72 (e.g., see FIG. 2) to the processing liquid supply pipe 43. Although illustration and detailed description of the configuration of the processing liquid supply mechanism 72 is omitted, the processing liquid supply mechanism 72 is constituted by, for example, a supply line connected to a gas supply source, and an opening/closing valve and a flow rate control valve interposed in the supply line. The processing liquid supply mechanism 72 may be configured to switch and supply the rinse liquid and a processing liquid other than the rinse liquid, for example, a chemical liquid (e.g., DHF).

At the central portion of the upper surface of the connecting portion 34, a cylindrical recessed portion 34b is formed to communicate with the gas passage 80. Most of the lower side of the head portion 42 is accommodated in the recessed portion 34b. The head portion 42 includes a flange portion 42a that protrudes radially outward beyond the outer peripheral end of the recessed portion 34b. A gas flowing upward in the gas passage 80 flows through a space defined between an inner surface of the recessed portion 34b and a surface of the head portion 42 opposite thereto, further flows through a gap between a lower surface of the flange portion 42a and an upper surface 34a of the connecting portion 34, and is injected to a space between the lower surface of the wafer W and the base plate 31a in a substantially horizontal direction toward the radially outer side (see, e.g., the white arrow in FIG. 3). That is, the gas injected from the outlet of the gap 82 is not directly sprayed to the lower surface of the wafer W. The outlet of the gap 82 constitutes a gas injecting portion.

Further, even when the processing liquid supplied to the lower surface of the wafer W drops from the liquid ejecting port 43a, it is possible to suppress the processing liquid from entering the gas passage 80 through the space 81 by the flange portion 42a.

As illustrated in FIG. 2, the recovery cup 50 is disposed so as to surround the substrate holding unit 31 of the substrate holding and rotating mechanism 30, and captures the processing liquid scattering from the rotating wafer W. The recovery cup 50 includes an immovable lower cup body 51 and an upper cup body 52 that is movable up and down between a raised position (the position illustrated in FIG. 2) and a lowered position. The upper cup body 52 moves up and down by an elevating mechanism 53. When the upper cup body 53 is at the lowered position, an upper end of the upper cup body 52 is positioned at a position lower than the wafer W held by the substrate holding and rotating mechanism 30. Therefore, when the upper cup body 52 is at the lowered position, it is possible to deliver the wafer W between the substrate holding mechanism (arm) of the substrate transfer device 17 illustrated in FIG. 1 which has entered the chamber 20 and the substrate holding and rotating mechanism 30.

A discharge port 54 is formed at a bottom portion of the lower cup body 51. The captured processing liquid and the atmosphere in the recovery cup 50 are discharged from the recovery cup through the discharge port 54. A discharge pipe 55 is connected to the discharge port 54, and the discharge pipe 55 is connected to a factory exhaust system (not illustrated) in a depressurized atmosphere.

The down flow of the clean air from the FFU 21 is drawn into the recovery cup 50 through an upper opening of the recovery cup 50 (the upper cup body 52), and is exhausted from the discharge port 54. Therefore, an air current indicated by an arrow F is generated in the recovery cup 50.

The processing unit 16 may include a processing liquid nozzle 61 that supplies a processing liquid to the upper surface of the wafer W held by the substrate holding and rotating mechanism 30. The processing fluid nozzle 61 may be positioned at an arbitrary position between a position directly above the center of the wafer W and a position directly above the periphery of the wafer W, and a standby position (home position) outside of the wafer W, by a nozzle arm (not illustrated). The processing fluid nozzle 61 may supply a chemical liquid, a rinse liquid, or two fluids (to be described later in detail).

The processing unit 16 may include a brush 62 that performs a scrub cleaning on the upper surface of the wafer W held by the substrate holding and rotating mechanism 30. The brush 62 may be positioned at an arbitrary position between the central portion of the wafer W and the peripheral portion of the wafer W, and a standby position (home position) outside of the wafer W, by the nozzle arm (not illustrated).

Next, an example of processing performed by the processing unit 16 will be described with reference to FIG. 6. Here, it is assumed that a deionized water rinse processing is performed on the lower surface (in the embodiment, a front surface on which a pattern is formed) while performing a scrub cleaning on the upper surface of the wafer W (in the embodiment, a rear surface on which a pattern is not formed). This processing is performed for the purpose of, for example, sufficiently removing particles from the rear surface of the wafer W to suppress defocusing during exposure of the wafer W. In this processing, only deionized water DIW is used as a processing liquid, and no chemical liquid is used. Further, in FIG. 1, one of the 12 processing units 16 is substituted with a reverser (not illustrated) that reverses the wafer.

Before being carried into the processing unit 16, the substrate transfer device 17 holding wafer W that is reversed by the reverser (not illustrated) so that the rear surface becomes an upper surface enters the chamber 20, and the wafer W is transferred to the substrate holding unit 31 of the substrate holding and rotating mechanism 30. Thereafter, the substrate holding mechanism (arm) is retracted from the chamber 20, and the upper cup body 52 is raised to the raised position.

Next, the substrate holding and rotating mechanism 30 rotates the wafer W. The wafer W continues to rotate until a series of processing on the wafer W is completed. In this state, while supplying deionized water to the upper surface of the wafer W, the rotating brush 62 is brought into contact with the central portion of the wafer and the brush 62 is moved to the peripheral portion of the wafer W, so that the scrub cleaning processing is performed on the entire upper surface of the wafer W (time T0 to T1 in FIG. 6).

The brush 62 is held by an arm (not illustrated) incorporating a brush rotating mechanism, and is movable between the central portion and the peripheral portion of the wafer W. The supply of deionized water to the upper surface of the wafer W may be performed by a deionized water ejecting unit incorporated in or integrated with the brush 62, or by the processing fluid nozzle 61 separately provided from the brush 62.

After completion of the scrub cleaning processing, the brush 62 moves away from the upper surface of the wafer W, and moves to the standby position outside the wafer W. Deionized water is supplied from the processing fluid nozzle 61 to the central portion of the upper surface of the wafer W, and the rinse processing is performed on the upper surface of the wafer W (time T1 to T2 in FIG. 6). After completion of the rinse processing, the supply of deionized water to the upper surface of the wafer W is stopped, and the shake-off drying of the wafer W is performed (time T2 to T4 in FIG. 6).

While performing the scrub cleaning processing and the rinse processing on the upper surface of the wafer W described above, a rinse processing of the wafer W is performed in order to suppress contamination of the lower surface (device forming surface) of the wafer W (time T0 to T2 in FIG. 6).

The rinse processing is performed by supplying deionized water as a rinse liquid to the central portion of the lower surface of the rotating wafer W from the liquid ejecting port 43a of the liquid ejecting unit 40. The deionized water supplied to the central portion of the lower surface of the wafer W spreads and flows radially outward due to centrifugal force, and scatters outward from the periphery of the wafer W. At this time, the entire lower surface of the wafer W is covered with the liquid film of the deionized water. The liquid film of the deionized water blocks deionized water including particles that are going around from the upper surface to the lower surface of the wafer W.

In order to suppress the rinse liquid from going around from the upper surface to the lower surface of the wafer, or from the lower surface to the upper surface, the rinse processing on the upper surface of the wafer and the rinse processing on the wafer may be completed at the same time or substantially at the same time. That is, the supply of the rinse liquid to the upper surface of the wafer W and the supply of the rinse liquid to the lower surface of the wafer W may be stopped substantially at the same time (time T2 in FIG. 6).

The liquid processing step has been described. Next, a drying step, that is, an operation of shifting to the time T2 in FIG. 6 will be described. The drying step is started when supply of the rinse liquid is stopped.

In the drying step, the oxygen concentration in the space between the wafer W and the base plate 31a of the substrate holding unit 31 may be lowered such that water marks (which may cause particles) does not occur on the lower surface of the wafer W. Therefore, nitrogen gas is injected into the space from the outlet of the gap 82 between the lower surface of the flange portion 42a of the head portion 42 and the upper surface 34a of the connecting portion 34.

In the example of FIG. 6, nitrogen gas is injected from the outlet (the gas injecting portion) of the gap 82 at a flow rate FR1 (e.g., 20 L/min) before the time T2, but the present disclosure is not limited thereto. The nitrogen gas may not be injected before the time T2.

As soon as the supply of the rinse liquid (deionized water) to the lower surface of the wafer W is stopped (that is, immediately at the time T2), nitrogen gas is injected at a high flow rate FR2 (e.g., 60 L/min). The timing of starting the injection of the nitrogen gas does not need to be completely simultaneously with the stop of the supply of the rinse liquid, and may be slightly before or after the stop of the supply of the rinse liquid.

The nitrogen gas injected at a high flow rate flows substantially uniformly with respect to the circumferential direction of the wafer W to the peripheral portion of the wafer W, and blows away the deionized water containing particles attached to the holding member 31b. The particles contained in the deionized water are mainly derived from substances removed from the upper surface of the wafer W by the scrub cleaning.

At the time T2 and a time slightly after the time T2 (e.g., time T3 in FIG. 6), since a liquid film having a sufficient thickness is present on the lower surface of the wafer W, even if nitrogen gas is injected at a high flow rate from the outlet (gas injecting portion) of the gap 82, the liquid film on the lower surface of the wafer W is not destroyed by the influence of the injected gas.

When the supply of the rinse liquid to the lower surface of the wafer W is stopped, and after a while, since the deionized water present on the lower surface of the wafer W flows to the periphery of the wafer W by centrifugal force, first initially, in the central portion of the wafer W, a liquid film LF of the deionized water is disappeared and the front surface (lower surface) of the wafer W is exposed. That is, a small circular drying area DA (also referred to as a "dry core") is formed in the central portion of the wafer W (also see, e.g., FIG. 4).

Thereafter, the drying area DA expands by lapse of time, and finally the entire lower surface of the wafer W is dried. During drying, a boundary B between the liquid film LF and the drying area DA may smoothly move radially outward while maintaining a substantially circular shape.

When the moving speed of the boundary B is inappropriate, there is a possibility that the liquid film is torn out and liquid droplets LD are separated from the liquid film. The situation when this phenomenon occurs is schematically illustrated in FIG. 6. The tear-off of the liquid droplets tends to occur in a case where the surface of the wafer is hydrophobic and a case where both a hydrophobic area and a hydrophilic area coexist on the surface of the wafer, and especially it is likely to occur in the latter case. As a specific example, under the circumstance where a plurality of rectangular circuit patterns are formed on the surface of the wafer W in a matrix form, there is a case where many hydrophobic portions are present on the surface of the rectangular patterns, and the area between the rectangles is hydrophilic. In this case, an event occurs, in which liquid droplets remain on the circuit patterns, and thereafter the liquid droplets are dried.

Particles may be present in the liquid film of the rinse liquid (deionized water). The particles may have originally been attached to the wafer W or may have been taken into the liquid film after being wound up by the nitrogen gas injected from the outlet of the gap 82. When the liquid droplets containing the particles are dried, the particles are attached to the surface of the wafer W. When the liquid droplets containing particles remain in the circuit pattern portion and the liquid droplets are dried, yield is adversely affected.

Meanwhile, even though particles are present in the liquid film, as described above, when the boundary B between the liquid film LF and the drying area DA maintains a substantially circular shape and smoothly moves radially outward, such a problem does not occur. That is, in this case, the particles in the liquid film move radially outward together with the liquid film and are discharged to the outside of the wafer W together with the liquid film, so that the particles do not remain on the surface of the wafer W.

Figure 5:
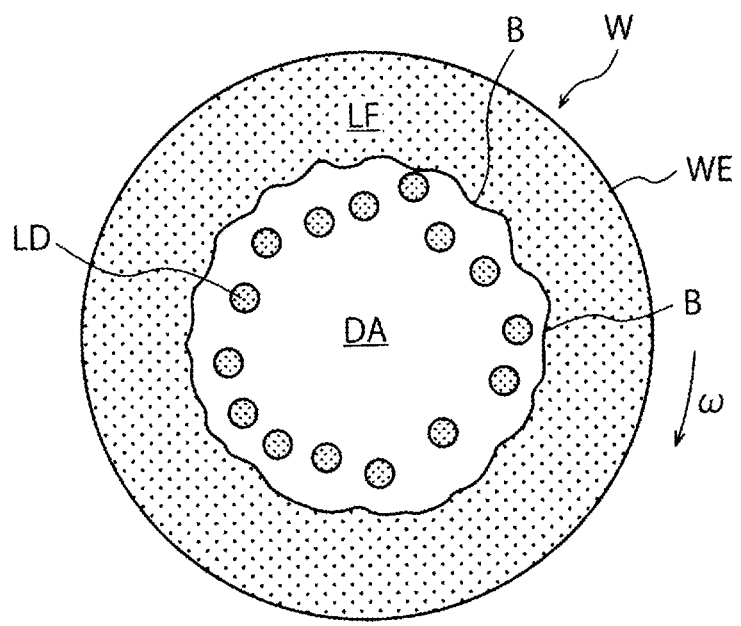
FIG. 5 is a view for explaining a defect that occurs during drying of the lower surface of the wafer.

Nitrogen gas is a low humidity gas (the same applies to an inert gas such as Ar gas). Thus, when the nitrogen gas flows through the space between the lower surface of the wafer W and the base plate 31a (the space below the wafer), the space below the wafer is maintained at a low humidity, and the drying of the lower surface of the wafer W is promoted. Therefore, when the nitrogen gas is continuously injected at a high flow rate from the outlet (gas injecting portion) of the gap 82, the situation as illustrated in FIG. 5 may occur.

Figure 4:
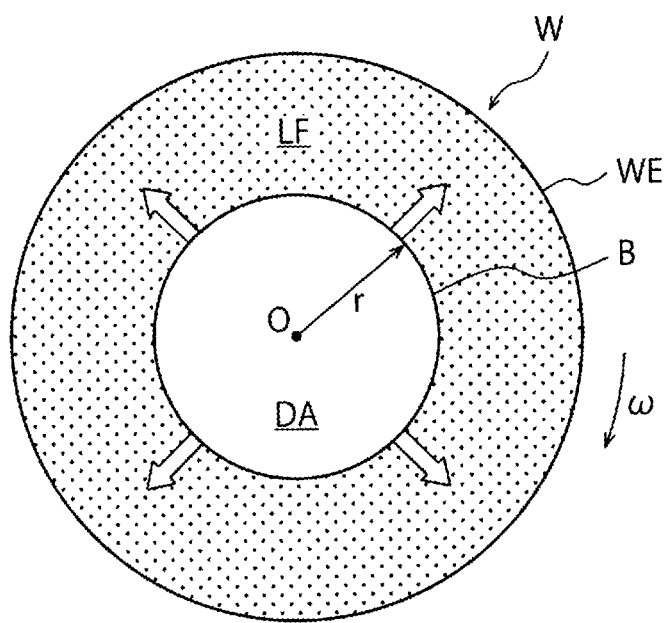
FIG. 4 is a view for explaining progress of drying of a lower surface of a wafer.

In the present embodiment, at the time T3 after the time T2, the flow rate of the nitrogen gas injected from the outlet of the gap 82 is decreased to FR3 (e.g., 10 L/min). Therefore, the drying of the lower surface of the wafer is suppressed, so that the drying proceeds in a suitable form as illustrated in FIG. 4.

The time T3 at which the flow rate of the nitrogen gas is decreased may be set to a time when the liquid film is not present at the central portion of the lower surface of the wafer W, that is, a time when the dry core DA is formed at the central portion of the lower surface of the wafer W. The time T3 depends on, for example, the flow rate of the high flow rate FR2 or a contact angle of the substrate, and is a numerical value obtained by experiments. Since the event illustrated in FIG. 5 occurs after the boundary B moves radially outward to some extent, the time T3 may be a time slightly after the dry core is formed at the central portion of the lower surface of the wafer W. Further, the time T3 may be a time slightly before the dry core is formed at the center of the lower surface of the wafer W.

The rotation speed of the wafer W may be constant in the entire drying processing. However, the tear-off of the liquid film LF is likely to occur when the boundary B is at a position close to a periphery WE of the wafer W. The reason is that, as the boundary B approaches the periphery WE, the liquid film LF becomes thinner, and a force of expanding the liquid film LF increases. When the boundary B approaches the periphery WE, the force of expanding the liquid film LF may be suppressed by reducing the rotation speed of the wafer W to a low level.

Drying of the upper surface of the wafer W will not be described in detail in this specification. For example, by using a known method of supplying a drying gas such as nitrogen gas is supplied from a drying gas nozzle (not illustrated) to the rotating wafer W while supplying the rinse liquid from the processing fluid nozzle 61 to the rotating wafer W, and moving both a radial direction position where the nitrogen gas collides with the wafer W (referred to as a "radial direction position PN") and a radial direction position where the rinse liquid collides with the wafer W (referred to as a "radial direction position PR") radially outside while maintaining the radial direction position PN radially inside the radial direction position PR, the drying may be satisfactorily performed while controlling the moving speed of the boundary between the drying area and the liquid film. That is, with respect to the upper surface of the wafer W, the tear-off of the liquid film may be suppressed by a known method, thereby performing drying in which particles do not remain.

According to the embodiment, when the nitrogen gas is supplied at a relatively high flow rate to the space below the wafer at the beginning of the drying step, the particles attached to the holding member 31B (and the surface of wafer W around the holding member) may be removed without adversely affecting the drying of the lower surface of the wafer W. Thereafter, when the nitrogen gas is supplied at a relatively low flow rate, the boundary between the liquid film LF and drying area DA may be smoothly moved radially outward while maintaining the boundary substantially circular shape.

In the above-described embodiment, the cleaning processing is performed in a state where the rear surface of the wafer W (the device non-forming surface) faces upward and the front surface of the wafer W (device forming surface) faces downward, but the present disclosure is not limited thereto. The cleaning processing may be performed in a state where the front surface of the wafer W faces upward and the rear surface of the wafer W faces downward. Further, the cleaning processing may be performed only on the surface of the wafer W facing downward without performing the cleaning processing on the surface of the wafer W facing upward.

A two-fluid cleaning processing may be performed instead of performing the scrub cleaning processing on the upper surface of the wafer W. The two-fluid cleaning is cleaning performed by spraying, onto the wafer W, two fluids, which are formed of a mixed fluid of a gas and droplets of a processing liquid (here, deionized water) made into mist by a gas (e.g., nitrogen gas), in the processing fluid nozzle 61 configured as a two-fluid nozzle. At this time, the processing fluid nozzle 61 reciprocates between the central portion and the peripheral portion of the wafer W by a nozzle arm (not illustrated) while injecting the two fluids. Therefore, the particles attached to the upper surface of the wafer W are removed by the energy of the two fluids. In this case, the supply of the nitrogen gas is stopped while continuing the supply of the deionized water to the processing fluid nozzle 61, and the deionized water that is not made into mist is supplied from the processing fluid nozzle 61 to the central portion of the upper surface of the wafer, thereby performing the rinse processing on the upper surface of the wafer W.

The substrate serving as a processing target is not limited to the semiconductor wafer (wafer W), but may be another kind of substrate such as, for example, a glass substrate or a ceramic substrate as long as the substrate is a disk-shaped substrate to be processed in a rotating state.

Next, referring to FIGS. 7A, 7B, 8, and 9, descriptions will be made on a holding member that may be suitably used for scrub cleaning. The holding member 31b schematically illustrated in FIG. 2 has a shape, for example, illustrated in FIGS. 7A, 7B, 8, and 9. That is, the holding member 31b has a holding portion (wafer holding claw) 311 which is in contact with the periphery of the wafer W on one side, and a pressed portion 312 on the other side. The holding portion 311 is pivotally attached to the base plate 31a (not illustrated in FIGS. 7A, 7B, 8, and 9) by a pin (not illustrated) inserted in a hole 313. When the pressed portion 312 is pushed up from below by a pressing member (not illustrated), the holding portion 311 is pivoted and moved to a released position away from the wafer W. Due to gravity acting on the heavy pressed portion 312 by the pressing member, the holding portion 311 is pivoted and moved to a holding position where the periphery of the wafer W is held. For details of the above mechanism, refer to Japanese Patent Laid-Open Publication No. 10-209254 (this is a publication related to the prior application by the present applicant), particularly, FIGS. 5 and 8 thereof.

Figure 8:
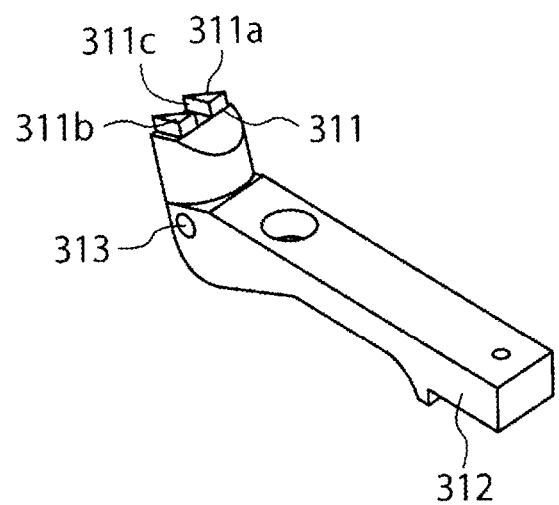
FIG. 8 is a perspective view of the modified substrate holding member illustrated in FIG. 7A.

The holding member illustrated in FIGS. 7A, 7B, 8, and 9 is a holding member that is modified from a part of a holding member illustrated in FIGS. 5 and 8 of Japanese Patent Laid-Open Publication No. 10-209254. FIG. 7B illustrates a prior art, and FIG. 7A illustrates an embodiment of the present disclosure. In FIG. 7A, the height of the holding portion (wafer holding claw) 311 is low. Two broken lines extending across FIGS. 7A and 7B indicate the thickness of the wafer W.

Figure 9:
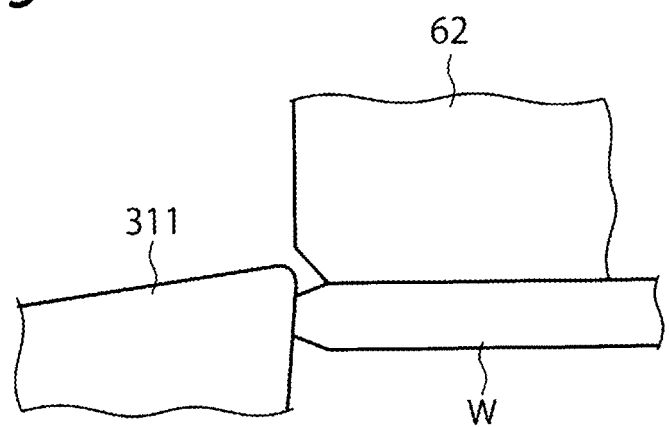
FIG. 9 is a view illustrating a positional relationship of the modified substrate holding member illustrated in FIG. 7A, a wafer held in the substrate holding member, and a brush.

By lowering the height of holding portion 311 in this manner, as illustrated in FIG. 9, the brush 62 may be brought into contact with the radially outermost portion (that is, the entire region radially inward of a bevel portion) of the flat portion of the upper surface of the wafer W. That is, it is possible to reliably remove the particles from the entire flat portion of the upper surface of the wafer W.

Further, by lowering the height of holding portion 311, it is possible to reduce liquid splashing caused by the processing liquid flowing from the central portion of the wafer W toward the peripheral portion in the holding portion 311.

Further, as illustrated in FIG. 8, the holding portion 311 includes a first portion 311a and a second portion 311b, and a gap 311c is formed between the first portion 311a and the second portion 311b. In addition, the first portion 311a and the second portion 311b are thinned toward the radially outer side of the wafer W. By doing so, the processing liquid easily passes through the holding portion 311, so that the liquid splashing may be further reduced.

Further, as illustrated in FIG. 7A, an upper surface 311d of the holding portion 311 is inclined so as to be lowered toward the radially outer side of the wafer W (when in the holding position). Therefore, the processing liquid easily climbs over the holding portion 311, so that the liquid splashing may be further reduced.

Next, another embodiment of a mechanism that supplies nitrogen gas to a substrate holding portion and a region below the wafer will be described with reference to FIGS. 10A to 10D. In FIGS. 10A to 10D, the same members as the members illustrated in FIG. 2 are denoted by the same reference numerals.

In the embodiment of FIGS. 10A to 10D, a plurality of, for example, three support columns 104 are provided on the base plate 31a of the substrate holding portion. A partition plate 105 is attached to the support column 104 to partition a space between the lower surface of the wafer W and the upper surface of the base plate 31a. Depending on the pressure difference between the space above the partition plate 105 and the space below the partition plate 105, the partition plate 105 may smoothly move up and down between a lower limit position (the position illustrated in FIGS. 10A to 10C) and a upper limit position (the position illustrated in FIG. 10D), along the support column 104. A wafer support member 106 is provided on an upper portion of each column 104.

Two tubular bodies 107 and 108 are arranged inside the hollow rotating shaft 32 coaxially with the rotating shaft 32. The inside of the hollow tubular bodies is configured as a rinse liquid passage, and an outlet of the upper end of the rinse liquid passage is a rinse liquid ejecting port 101. The rinse liquid is ejected from the rinse liquid ejecting port 101 directly upward.

A first gas passage is formed between the tubular body 107 and the tubular body 108, and an outlet of the upper end of the first gas passage is configured as a first gas ejecting port 102. An inert gas, for example nitrogen gas is supplied outward in radial direction (outside of the wafer W in the radial direction) from the first gas ejecting port 102.

A second gas passage is formed between the rotating shaft 32 and the tubular body 107, and an outlet of the upper end of the second gas passage is configured as a second gas ejecting port 103. An inert gas, for example nitrogen gas is supplied outward in radial direction from the second gas ejecting port 103.

Next, descriptions will be made on a procedure of performing a scrub cleaning processing on the upper surface of the wafer W and a rinse processing on the lower surface of the wafer W using the substrate processing apparatus of FIGS. 10A to 10D. While performing a series of the following processing steps, the wafer W is rotating through the processing steps.

Figure 10A:
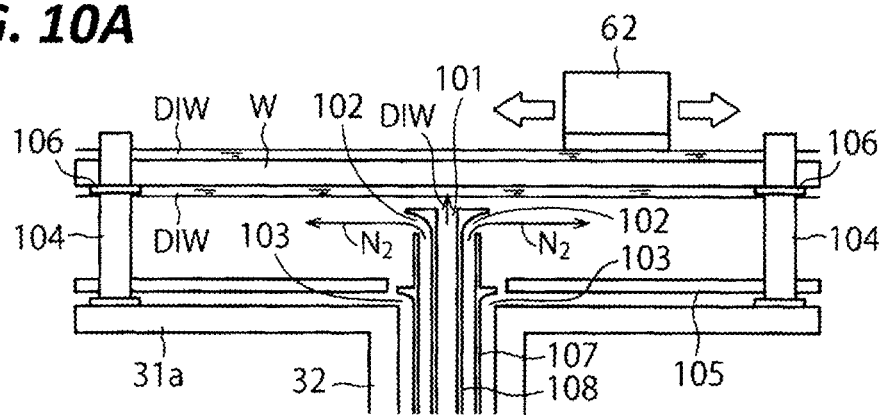
FIGS. 10A to 10D are a schematic vertical sectional view illustrating an embodiment of a substrate holding and rotating mechanism provided with a movable partition plate.

FIG. 10A illustrates a cleaning step. In the cleaning step, a rinse processing is performed by supplying the rinse liquid (deionized water) from the rinse liquid ejecting port 101 to the central portion of the lower surface of the wafer W, while supplying deionized water to the upper surface of the wafer W and performing the scrub cleaning by the brush 62. The lower surface of the wafer W is covered with the liquid film of the rinse liquid. At this time, nitrogen gas is supplied from the first gas ejecting port 102, whereas nitrogen gas is not supplied from the second gas ejecting port 103. Therefore, since the pressure of the space above the partition plate 105 increases, the partition plate 105 is positioned at the lower limit position.

Figure 10B:
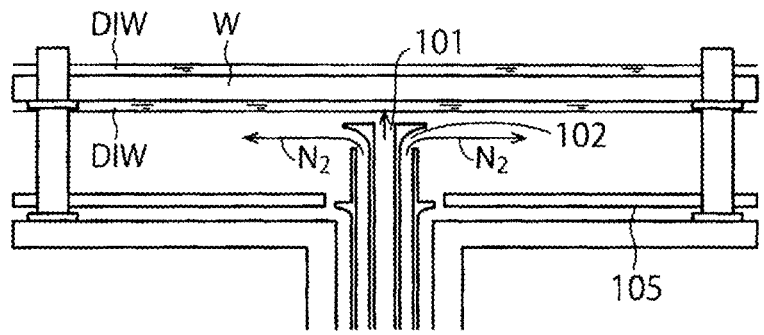

FIG. 10B illustrates a rinsing step performed following the cleaning step. In the rinsing step, a rinse processing is performed by supplying the rinse liquid (deionized water) from the rinse liquid ejecting port 101 to the central portion of the lower surface of the wafer W, and at the same time, a rinse processing is performed by supplying the rinse liquid (deionized water) to the upper surface of the wafer W. The lower surface of the wafer W is covered with the liquid film of the rinse liquid. Also at this time, the nitrogen gas is supplied from the first gas ejecting port 102, whereas the nitrogen gas is not supplied from the second gas ejecting port 103. Therefore, since the pressure of the space above the partition plate 105 increases, the partition plate 105 is positioned at the lower limit position.

Figure 10C:
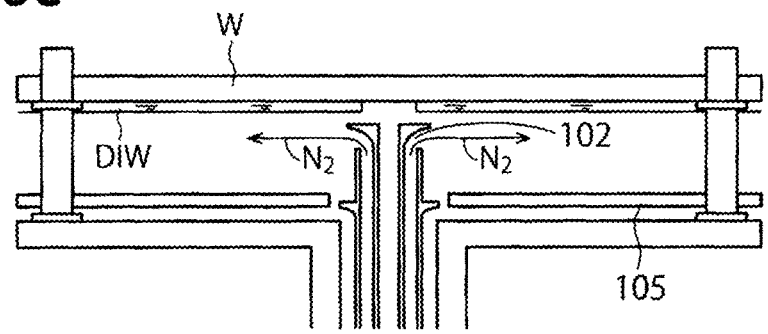
Figure 10D:
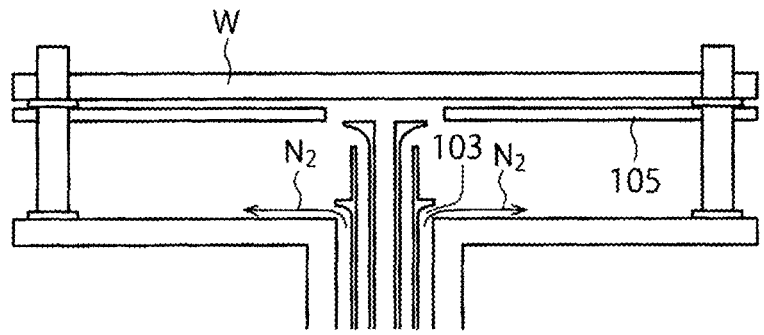

FIGS. 10C and 10D illustrate a drying step performed following the rinsing step. When transitioning from the rinsing step to the drying step, the supply of rinse liquid to the upper surface and lower surface of the wafer W is stopped.

FIG. 10C illustrates a state of an initial stage of the drying step. Also at this time, the nitrogen gas is supplied from the first gas ejecting port 102, whereas the nitrogen gas is not supplied from the second gas ejecting port 103. Therefore, since the pressure of the space above the partition plate 105 increases, the partition plate 105 is positioned at the lower limit position.

FIG. 10D illustrates a state of a later stage of the drying step. The later stage of the drying step is timing after the rinse liquid is removed from at least a part of the lower surface of the wafer W and the part of the lower surface is started to be exposed. At this time, the supply of the nitrogen gas from the first gas ejecting port 102 is stopped, and the supply of the nitrogen gas from the second gas ejecting port 103 is performed. Therefore, since the pressure of the space below the partition plate 105 increases, the partition plate 105 is positioned at the upper limit position. As a result, the lower surface of the wafer W is covered with the partition plate 105 which is close to the lower surface. Therefore, it is possible to suppress contaminated mist drifting in the space below the wafer W from adhering to the lower surface of the wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate holder including a plate having a holding portion provided thereon, the holding portion holds a peripheral portion of a substrate;
   a rotator including a rotation shaft that rotates the substrate by rotating the plate;
   a processing liquid supply that is disposed at a center of the rotator and supplies a processing liquid and an inert gas to a lower surface of the substrate held by the substrate holder; and
   a controller that performs an overall control of the substrate processing apparatus,
   wherein the controller is programmed to:
   first supply the processing liquid to the lower surface of the substrate while rotating the substrate thereby performing a liquid processing on the lower surface of the substrate, stop the supply of the processing liquid to the lower surface of the substrate in the first supply, second supply the inert gas at a first supply flow rate in an initial state where a liquid film covers the lower surface of the substrate including a central portion of the lower surface of the substrate while rotating the substrate, a combination of the supply of the inert gas at the first supply flow rate and rotation of the substrate together forming a dry core on the lower surface of the substrate, the dry core being surrounded by the liquid film and positioned at the central portion of the lower surface of the substrate, and third supply the inert gas at a second supply flow rate lower than the first supply flow rate at a predetermined time after the second supply is started while rotating the substrate, wherein a rotation speed of the substrate is constant throughout the second supply when the dry core is formed and at least a portion of the third supply as a boundary of the dry core approaches a periphery of the substrate.

2. The substrate processing apparatus of claim 1, wherein a portion of the processing liquid supplied in the liquid processing is attached to the substrate holder and the first supply flow rate is a flow rate sufficient to blow off the processing liquid attached to the substrate holder.

3. The substrate processing apparatus of claim 2, wherein, in the first supply, the inert gas is supplied at a third flow rate, and the second supply flow rate is lower than the third flow rate.

4. The substrate processing apparatus of claim 3, further comprising:

a brush configured to perform a cleaning by scrubbing an upper surface of the substrate held in the substrate holder, wherein the controller is further programmed to control the brush to scrub the upper surface of the substrate while performing the liquid processing on the lower surface of the substrate.

5. The substrate processing apparatus of claim 2, further comprising:

a brush configured to perform a cleaning by scrubbing an upper surface of the substrate held in the substrate holder, wherein the controller is further programmed to control the brush to scrub the upper surface of the substrate while performing the liquid processing on the lower surface of the substrate.

6. The substrate processing apparatus of claim 1, wherein, in the first supply the inert gas is supplied at a third flow rate, and the second supply flow rate is lower than the third flow rate.

7. The substrate processing apparatus of claim 6, further comprising:

a brush configured to perform a cleaning by scrubbing an upper surface of the substrate held in the substrate holder, wherein the controller is further programmed to control the brush to scrub the upper surface of the substrate while performing the liquid processing on the lower surface of the substrate.

8. The substrate processing apparatus of claim 1, further comprising:

a brush configured to perform a cleaning by scrubbing an upper surface of the substrate held in the substrate holder, wherein the controller is further programmed to control the brush to scrub the upper surface of the substrate while performing the liquid processing on the lower surface of the substrate.

* * * * *